(12) United States Patent
Kurosawa

(10) Patent No.: US 7,683,631 B2
(45) Date of Patent: Mar. 23, 2010

(54) INVERSE CHARACTERISTIC MEASURING APPARATUS, DISTORTION COMPENSATION APPARATUS, METHOD, PROGRAM, AND RECORDING MEDIUM

(75) Inventor: Makoto Kurosawa, Saitama (JP)

(73) Assignee: Advantest Corporation, Tokyo (JP)

( * ) Notice: Subject to any disclaimer, the term of this patent is extended or adjusted under 35 U.S.C. 154(b) by 338 days.

(21) Appl. No.: 11/571,692

(22) PCT Filed: Sep. 12, 2005

(86) PCT No.: PCT/JP2005/017200

§ 371 (c)(1),
(2), (4) Date: Feb. 8, 2007

(87) PCT Pub. No.: WO2006/030919

PCT Pub. Date: Mar. 23, 2006

(65) Prior Publication Data

US 2008/0036470 A1   Feb. 14, 2008

(30) Foreign Application Priority Data

Sep. 15, 2004   (JP) ............... P2004-268181

(51) Int. Cl.
*G01R 23/00* (2006.01)
(52) U.S. Cl. ...................... 324/626; 324/620
(58) Field of Classification Search ............ 324/626, 324/620
See application file for complete search history.

(56) References Cited

U.S. PATENT DOCUMENTS 6,462,617 B1 * 10/2002 Kim .................. 330/2

7,248,644 B2 * 7/2007 Adachi et al. ............ 375/296

FOREIGN PATENT DOCUMENTS

| JP | 11-118873 | 4/1999 |
|----|-----------|--------|
| JP | 2001-268150 | 9/2001 |
| JP | 2002-77285 | 3/2002 |

OTHER PUBLICATIONS

English language Abstract of JP 2002-77285.
English language Abstract of JP 2001-268150.
English language Abstract of JP 11-118873.
U.S. Appl. No. 11/567,942, Ukita, filed Dec. 7, 2006.
U.S. Appl. No. 11/619,406, Ukita, filed Jan. 3, 2007.

* cited by examiner

*Primary Examiner*—Amy He
(74) *Attorney, Agent, or Firm*—Greenblum & Bernstein, P.L.C.

(57) ABSTRACT

A nonlinear distortion is compensated based upon a characteristic relating to a characteristic of a device under test. An inverse characteristic measuring device measures an output signal output from the device under test as a result of supplying the device under test with an input signal generated by a signal source. Further, the inverse characteristic measuring device acquires an ideal signal output from the device under test based upon the input signal if the device under test is ideal. Moreover, the inverse characteristic measuring device acquires an inverse characteristic which is a relation of the ideal signal with respect to the output signal. This inverse characteristic is applied to a distortion compensator. The distortion compensator supplies the device under test with the input signal converted based upon the inverse characteristic. As a result, a signal output from the device under test is an ideal signal whose distortion caused by the device under test is compensated.

12 Claims, 12 Drawing Sheets

INVERSE CHARACTERISTIC MEASURING APPARATUS, DISTORTION COMPENSATION APPARATUS, METHOD, PROGRAM, AND RECORDING MEDIUM

TECHNICAL FIELD

The present invention relates to a compensation of a nonlinear distortion.

BACKGROUND ART

If an input signal is supplied to an amplifier, the input signal is amplified, and is output. If the output signal and input signal are denoted as y and x respectively, y is represented as a1·x. However, during the amplification by the amplifier, a distortion occurs, and is added to the output signal y. This distortion is nonlinear, and can be represented as $a2 \cdot x^2 + a3 \cdot x^3 + a4 \cdot x^4 + \ldots$. A measurement of this nonlinear distortion has been conventionally practiced (refer to Japanese Laid-Open Patent Publication (Kokai) No. H11-118873), for example. This nonlinear distortion is observed not only in amplifies but also in general electronic devices.

However, even if the nonlinear distortion is measured, it is not easy to determine how to compensate the nonlinear distortion.

It is an object of the present invention to compensate the nonlinear distortion based upon a characteristic relating to a characteristic of a device under test.

DISCLOSURE OF THE INVENTION

According to an aspect of the present invention, an inverse characteristic measuring apparatus includes: a signal measuring unit that measures an output signal output from a device under test as a result of the device under test being supplied with an input signal; an ideal signal acquiring unit that acquires an ideal signal output from the device under test based upon the input signal if the device under test is ideal; and an inverse characteristic acquiring unit that acquires an inverse characteristic which is a relation of the ideal signal with respect to the output signal.

According to the thus constructed inverse characteristic measuring apparatus, a signal measuring unit measures an output signal output from a device under test as a result of the device under test being supplied with an input signal. An ideal signal acquiring unit acquires an ideal signal output from the device under test based upon the input signal if the device under test is ideal. An inverse characteristic acquiring unit acquires an inverse characteristic which is a relation of the ideal signal with respect to the output signal.

According to the present invention, the inverse characteristic measuring apparatus may further include an input signal measuring unit that measures the input signal, wherein the ideal signal acquiring unit may acquire the ideal signal based upon the measured input signal.

According to the inverse characteristic measuring apparatus of the present invention, the input signal may be generated based upon a recorded content in a waveform recording unit that records a waveform of the input signal; and the ideal signal acquiring unit may acquire the ideal signal based upon the waveform recorded in the waveform recording unit.

According to another aspect of the present invention, an inverse characteristic measuring apparatus includes: an input signal measuring unit that measures an input signal generated based upon a recorded content in a waveform recording unit that records a waveform; an ideal signal acquiring unit that acquires the recorded content in the waveform recording unit as an ideal signal; and an inverse characteristic acquiring unit that acquires an inverse characteristic which is a relation of the ideal signal with respect to the measured input signal.

According to the thus constructed inverse characteristic measuring apparatus, an input signal measuring unit measures an input signal generated based upon a recorded content in a waveform recording unit that records a waveform. An ideal signal acquiring unit acquires the recorded content in the waveform recording unit as an ideal signal. An inverse characteristic acquiring unit acquires an inverse characteristic which is a relation of the ideal signal with respect to the measured input signal.

According to the present invention, a distortion compensation apparatus acquires the inverse characteristic from the inverse characteristic measuring apparatus, and provides the device under test with a result of a conversion of the input signal based upon the inverse characteristic.

According to the present invention, a distortion compensation apparatus acquires the inverse characteristic from the inverse characteristic measuring apparatus, and converts the waveform recorded in the waveform recording unit based upon the inverse characteristic, wherein the input signal is generated based upon a result of the conversion by the distortion compensation apparatus.

According to another aspect of the present invention, an inverse characteristic measuring method includes: a signal measuring step of measuring an output signal output from a device under test as a result of the device under test being supplied with an input signal; an ideal signal acquiring step of acquiring an ideal signal output from the device under test based upon the input signal if the device under test is ideal; and an inverse characteristic acquiring step of acquiring an inverse characteristic which is a relation of the ideal signal with respect to the output signal.

According to another aspect of the present invention, an inverse characteristic measuring method includes: an input signal measuring step of measuring an input signal generated based upon a recorded content in a waveform recording unit that records a waveform; an ideal signal acquiring step of acquiring the recorded content in the waveform recording unit as an ideal signal; and an inverse characteristic acquiring step of acquiring an inverse characteristic which is a relation of the ideal signal with respect to the measured input signal.

Another aspect of the present invention is a program of instructions for execution by the computer to perform an inverse characteristic measuring process, the inverse characteristic measuring process including: a signal measuring step of measuring an output signal output from a device under test as a result of the device under test being supplied with an input signal; an ideal signal acquiring step of acquiring an ideal signal output from the device under test based upon the input signal if the device under test is ideal; and an inverse characteristic acquiring step of acquiring an inverse characteristic which is a relation of the ideal signal with respect to the output signal.

Another aspect of the present invention is a program of instructions for execution by the computer to perform an inverse characteristic measuring process, the inverse characteristic measuring process including: an input signal measuring step of measuring an input signal generated based upon a recorded content in a waveform recording unit that records a waveform; an ideal signal acquiring step of acquiring the recorded content in the waveform recording unit as an ideal signal; and an inverse characteristic acquiring step of acquiring an inverse characteristic which is a relation of the ideal signal with respect to the measured input signal.

Another aspect of the present invention, is a computer-readable medium having a program of instructions for execution by the computer to perform an inverse characteristic measuring process, the inverse characteristic measuring process including: a signal measuring step of measuring an output signal output from a device under test as a result of the device under test being supplied with an input signal; an ideal signal acquiring step of acquiring an ideal signal output from the device under test based upon the input signal if the device under test is ideal; and an inverse characteristic acquiring step of acquiring an inverse characteristic which is a relation of the ideal signal with respect to the output signal.

Another aspect of the present invention is a computer-readable medium having a program of instructions for execution by the computer to perform an inverse characteristic measuring process, the inverse characteristic measuring process including: an input signal measuring step of measuring an input signal generated based upon a recorded content in a waveform recording unit that records a waveform; an ideal signal acquiring step of acquiring the recorded content in the waveform recording unit as an ideal signal; and an inverse characteristic acquiring step of acquiring an inverse characteristic which is a relation of the ideal signal with respect to the measured input signal.

BEST MODE FOR CARRYING OUT THE INVENTION

A description will now be given of embodiments of the present invention with reference to drawings.

FIRST EMBODIMENT

Figure 1:
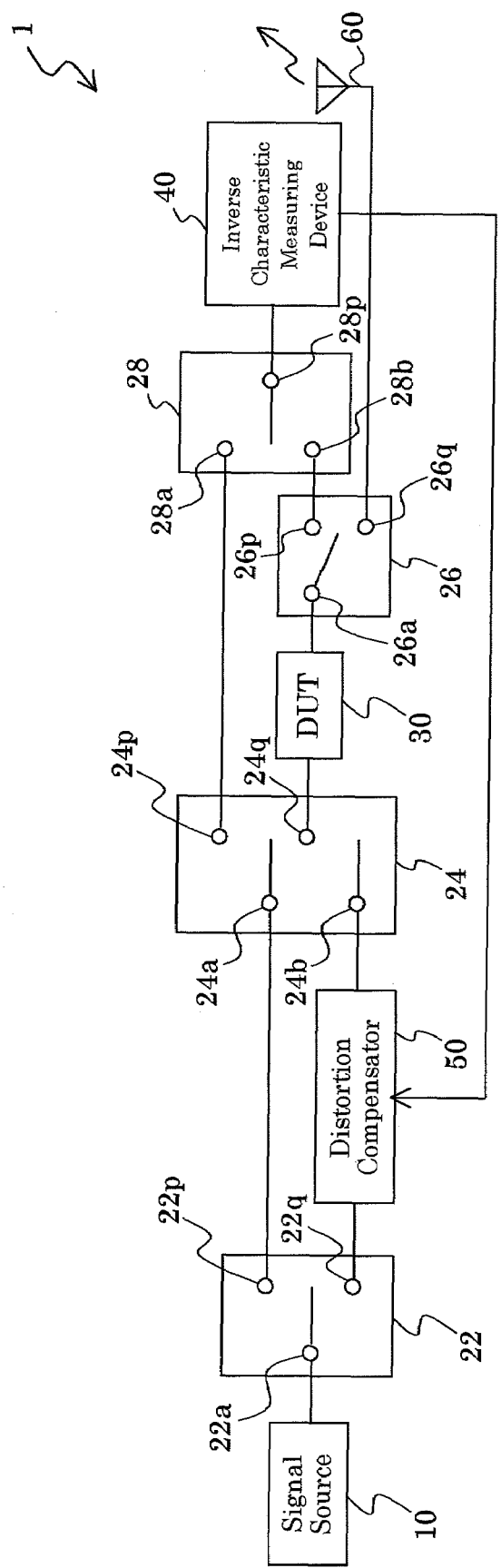
FIG. 1 is a functional block diagram showing a configuration of a transmission system 1 according to a first embodiment of the present invention.

FIG. 1 is a functional block diagram showing a configuration of a transmission system 1 according to a first embodiment of the present invention. The transmission system 1 is provided with a signal source 10, switches 22, 24, 26, and 28, a device under test (DUT) 30, an inverse characteristic measuring device 40, a distortion compensator 50, and an antenna 60.

The signal source 10 generates an input signal applied to the device under test 30.

The switch 22 leads the input signal generated by the signal source 10 to the distortion compensator 50 or the switch 24. The switch 22 includes an input terminal 22a, and output terminals 22p and 22q. The input terminal 22a is connected to the signal source 10. The output terminal 22p is connected to the switch 24. The output terminal 22q is connected to the distortion compensator 50. The switch 22 connects the input terminal 22a to the output terminal 22p or the output terminal 22q.

The switch 24 leads the input signal generated by the signal source 10 to the device under test 30 or the switch 28. Alternatively, the switch 24 leads the output from the distortion compensator 50 to the device under test 30. The switch 24 includes input terminals 24a and 24b, and output terminals 24p and 24q. The input terminal 24a is connected to the output terminal 22p of the switch 22. The input terminal 24b is connected to the distortion compensator 50. The output terminal 24p is connected to the switch 28. The output terminal 24q is connected to the device under test 30. The switch 24 connects the input terminal 24a to the output terminal 24p or the output terminal 24q or disconnects the input terminal 24a. Alternatively, the switch 24 connects the input terminal 24b to the output terminal 24q or disconnects the input terminal 24b.

The switch 26 leads an output signal output from the device under test 30 to the antenna 60 or the switch 28. The switch 26 includes an input terminal 26a, and output terminals 26p and 26q. The input terminal 26a is connected to the device under test 30. The output terminal 26p is connected to the switch 28. The output terminal 26q is connected to the antenna 60. The switch 26 connects the input terminal 26a to the output terminal 26p or the output terminal 26q.

The switch 28 leads the output signal output from the device under test 30 or the input signal generated by the signal source 10 to the inverse characteristic measuring device 40. The switch 28 includes input terminals 28a and 28b, and an output terminal 28p. The input terminal 28a is connected to the output terminal 24p of the switch 24. The input terminal 28b is connected to the output terminal 26p of the switch 26. The output terminal 28p is connected to the inverse characteristic measuring device 40. The switch 28 connects the input terminal 28a or the input terminal 28b to the output terminal 28p.

The device under test (DUT) 30 receives the input signal generated by the signal source 10 from the output terminal 24q of the switch 24 or the input signal distortion-compensated by the distortion compensator 50, and outputs the output signal to the input terminal 26a of the switch 26. The device under test 30 is an amplifier, for example.

Figure 2:
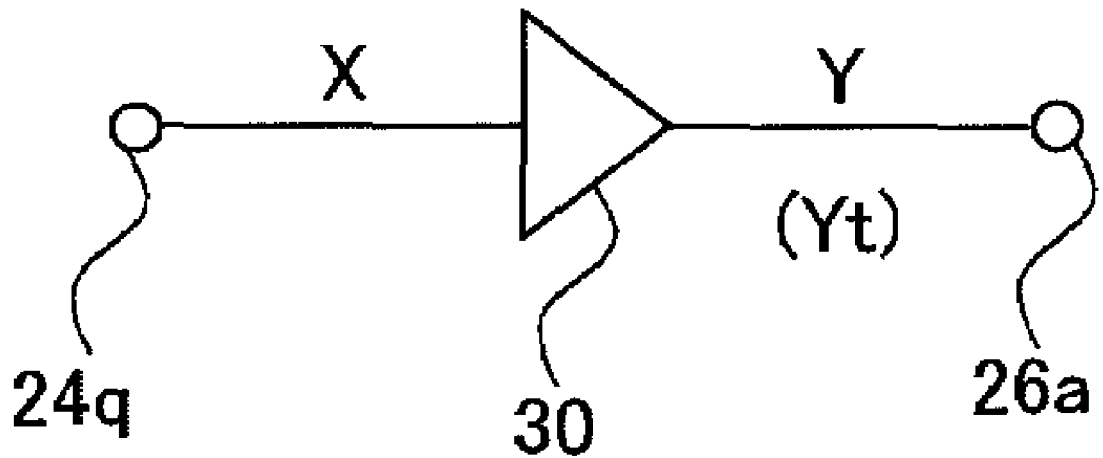
FIG. 2 is a diagram describing a relationship between an input signal X and an output signal Y while the device under test 30 is an amplifier.

FIG. 2 shows a diagram describing a relationship between an input signal X and an output signal Y while the device under test 30 is an amplifier. If Y=f(X), a distortion caused by the device under test 30 is added to the output signal Y. The function f represents an AM/AM characteristic or an AM/PM characteristic, for example. If the function f is an even function up to eighth order $(a_0+a_2X^2+a_4X^4+a_6X^6+a_8X^8)$, the function can approximate the AM/AM characteristic. If the function f is a polynomial up to ninth order ($a_0+a_1X+a_2X^2+ \ldots +a_9X^9$), the function can approximate the AM/PM characteristic. It should be noted that the function f may be configured as other polynomials and exponential functions to represent the AM/AM characteristic or the AM/PM characteristic. If the device under test 30 is ideal (namely, does not add a distortion to the output signal Y), the signal output from the device under test 30 is referred to as ideal signal Yt. It is assumed that Yt=g(X). Moreover, it is assumed that Y=h(Yt) on this occasion.

Figure 3:
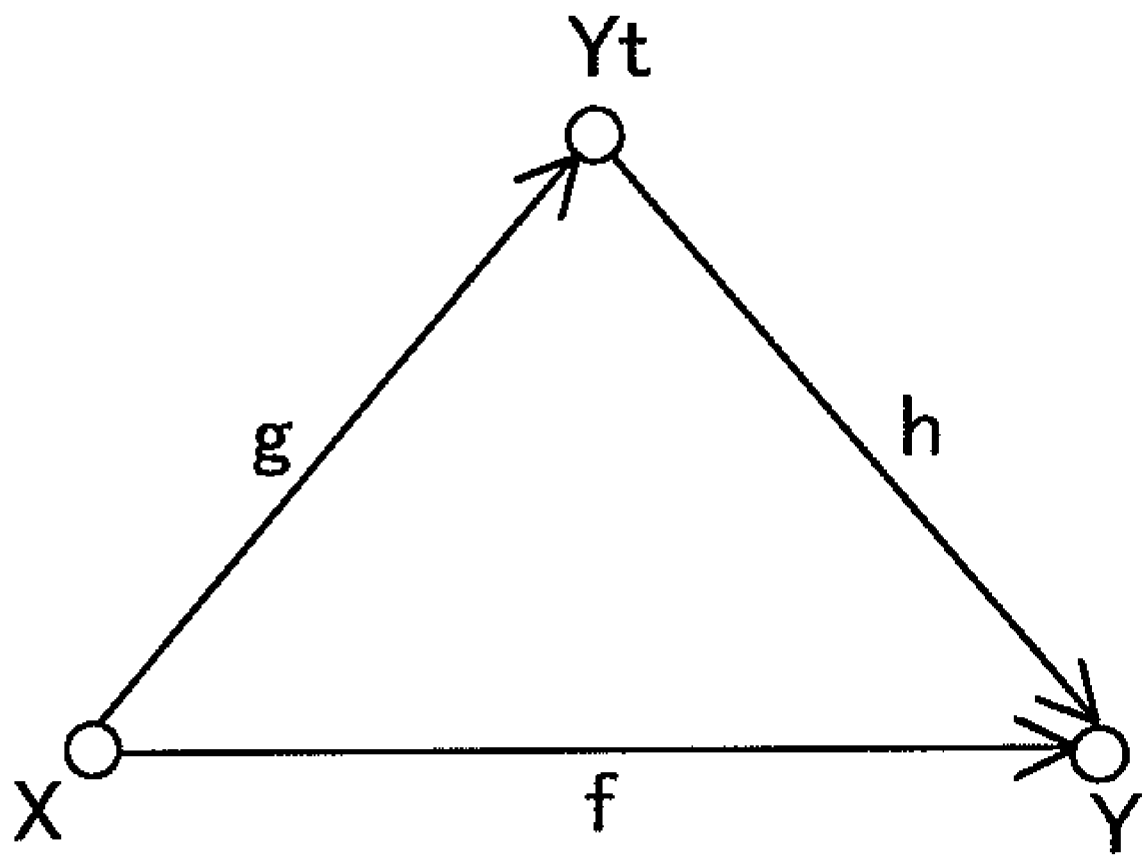
FIG. 3 is a diagram showing relationships between functions f, g, and h.

FIG. 3 shows relationships between functions f, g, and h. According to FIG. 3, $Yt=h^{-1}(Y)=g(X)=g(f^{-(Y)})$.

Figure 4:
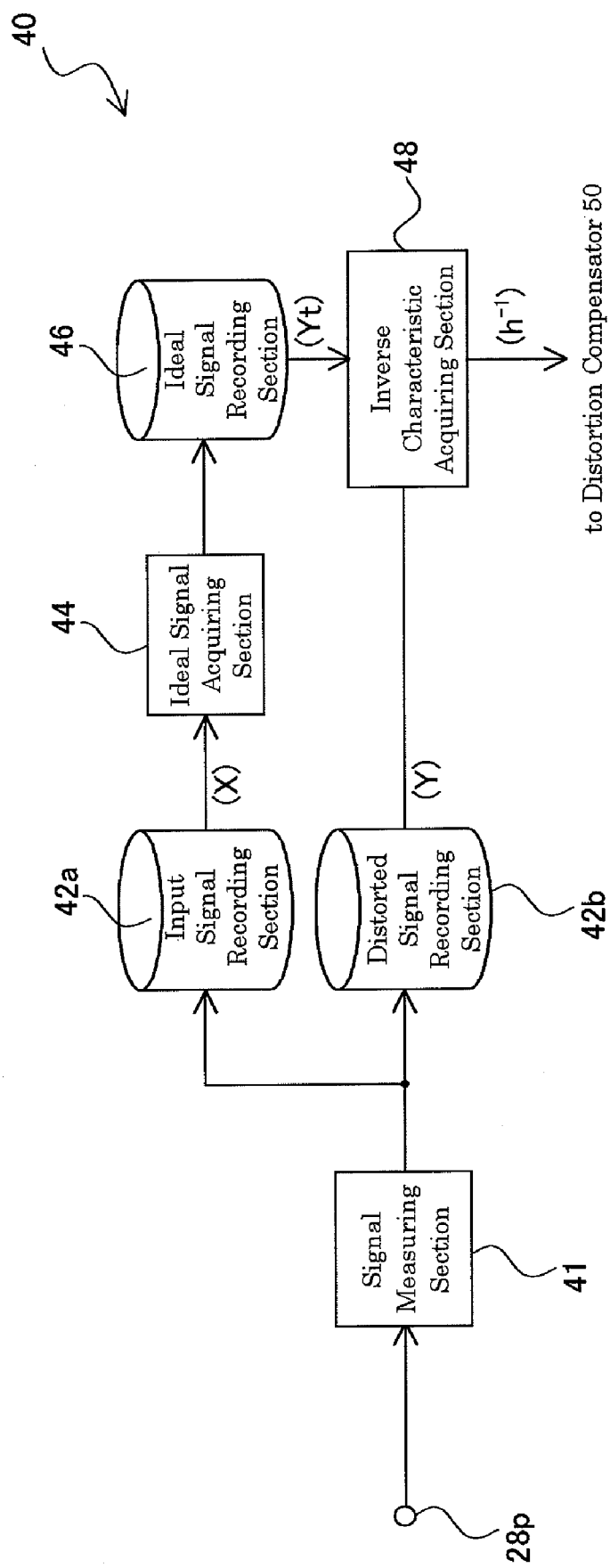
FIG. 4 is a functional block diagram showing a configuration of the inverse characteristic measuring device 40 according the first embodiment.

FIG. 4 is a functional block diagram showing a configuration of the inverse characteristic measuring device 40 according the first embodiment. The inverse characteristic measuring device 40 is provided with a signal measuring section 41, an input signal recording section 42a, a distorted signal recording section 42b, an ideal signal acquiring section 44, an ideal signal recording section 46, and an inverse characteristic acquiring section 48. The inverse characteristic measuring device 40 is used to obtain the function $h^{-1}$, namely a relation of the ideal signal Yt with respect to the output signal Y The function $h^{-1}$ is referred to as an inverse characteristic.

The signal measuring section 41 measures the signal received from the output terminal 28p of the switch 28. For example, the signal measuring section 41 measures the power and the phase of the signal. The signal received from the output terminal 28p is the output signal output from the device under test 30 or the input signal generated by the signal source 10. The signal measuring section 41 thus measures the output signal or the input signal.

The input signal recording section 42a receives and records a result of the measurement of the input signal from the signal measuring section 41.

The distorted signal recording section 42b receives and records a result of the measurement of the output signal from the signal measuring section 41. The output signal is distorted due to an influence from the device under test 30.

The ideal signal acquiring section 44 obtains an ideal signal output from the ideal device under test 30 if the input signal recorded in the input signal recording section 42a is applied to the ideal device under test 30. For example, if the ideal signal is represented as Yt=g(X), the ideal signal Yt is acquired by assigning the input signal recorded in the input signal recording section 42a to X.

The ideal signal recording section 46 receives and records the ideal signal Yt output from the ideal signal acquiring section 44.

The inverse characteristic acquiring section 48 acquires the function $h^{-1}$, namely the relation of the ideal signal Yt with respect to the output signal Y. The function $h^{-1}$ is applied to the distortion compensator 50. It should be noted that the output signal Y is acquired from the distorted signal recording section 42b, and the ideal signal Yt is acquired from the ideal signal recording section 46.

The distortion compensator 50 receives the input signal X generated by the signal source 10 from the output terminal 22q of the switch 22, converts the input signal X based upon the function $h^{-1}$, and outputs the input signal $h^{-1}(X)$, which is distortion-compensated, to the input terminal 24b of the switch 24.

The antenna 60 receives the output signal of the device under test 30 from the output terminal 26q of the switch 26, and transmits the output signal.

Figure 5:
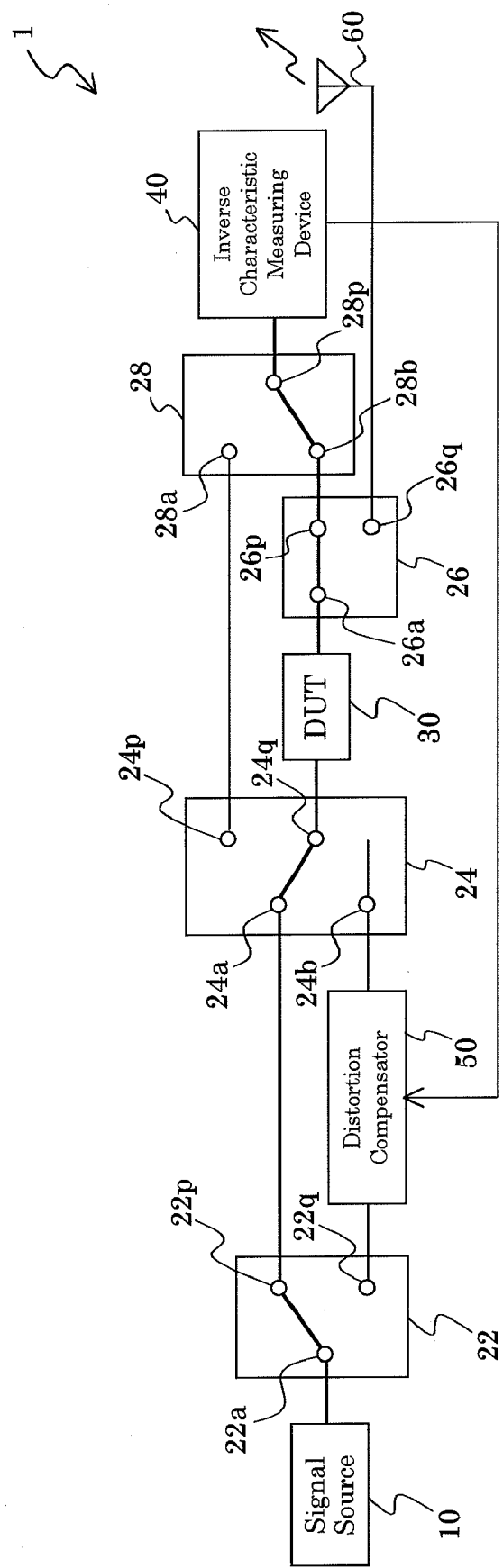
FIG. 5 is a diagram showing connection states of the switches 22, 24, 26, and 28 upon the measurement of the output signal Y.
Figure 6:
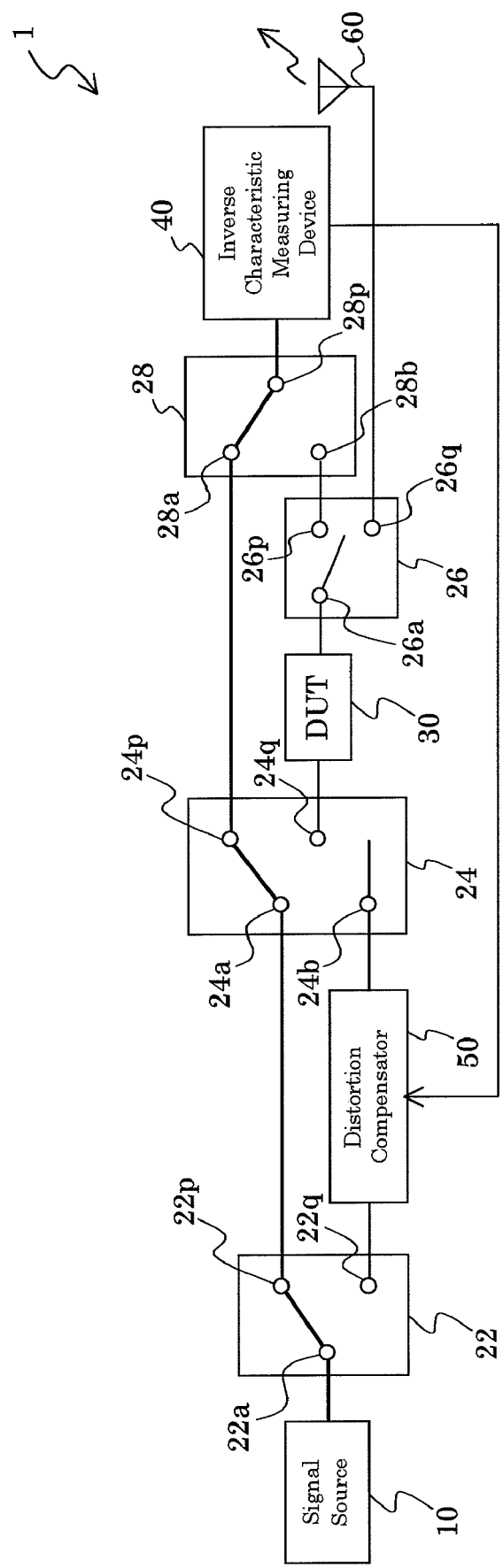
FIG. 6 is a diagram showing connection states of the switches 22, 24, 26, and 28 upon the measurement of the input signal X.
Figure 7:
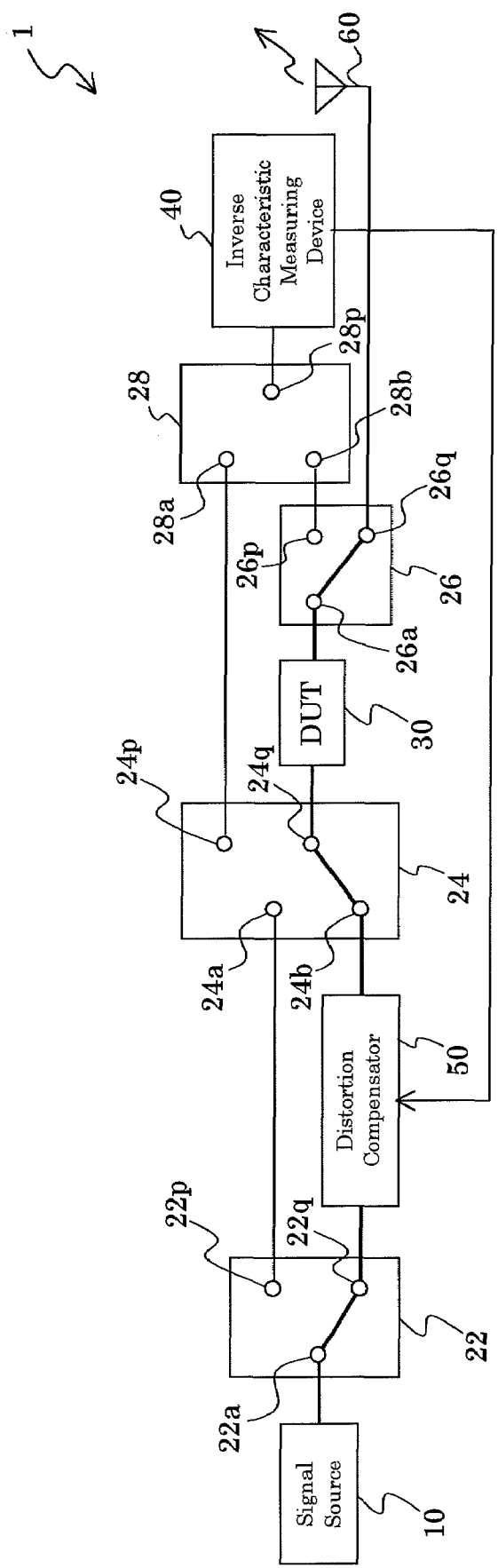
FIG. 7 is a diagram showing connection states of the switches 22, 24, 26, and 28 upon the distortion compensation by the distortion compensator 50.

A description will now be given of an operation of the first embodiment with reference to FIGS. 5 to 8. It should be noted that FIG. 5 shows connection states of the switches 22, 24, 26, and 28 upon the measurement of the output signal Y FIG. 6 shows connection states of the switches 22, 24, 26, and 28 upon the measurement of the input signal X. FIG. 7 shows connection states of the switches 22, 24, 26, and 28 upon the distortion compensation by the distortion compensator 50.

First, with reference to FIG. 5, the input terminal 22a and the output terminal 22p of the switch 22 are connected, the input terminal 24a and the output terminal 24q of the switch 24 are connected, the input terminal 26a and the output terminal 26p of the switch 26 are connected, and the input terminal 28b and the output terminal 28p of the switch 28 are connected to each other.

The input signal X generated by the signal source 10 is applied to the device under test 30 via the switches 22 and 24. The device under test 30 outputs the output signal Y. The output signal Y is applied to the inverse characteristic measuring device 40 via the switches 26 and 28. The signal measuring section 41 in the inverse characteristic measuring device 40 measures the output signal Y, and records a measured result in the distorted signal recording section 42b.

Then, with reference to FIG. 6, the input terminal 22a and the output terminal 22p of the switch 22 are connected, the input terminal 24a and the output terminal 24p of the switch 24 are connected, and the input terminal 28a and the output terminal 28p of the switch 28 are connected to each other.

The input signal X generated by the signal source 10 is applied to the inverse characteristic measuring device 40 via the switches 22, 24, and 28. The signal measuring section 41 in the inverse characteristic measuring device 40 measures the input signal X, and records a measured result in the input signal recording section 42a.

The ideal signal acquiring section 44 acquires the ideal signal Yt based upon the input signal X recorded in the input signal recording section 42a (Yt=g(X)). The ideal signal Yt is recorded in the ideal signal recording section 46.

The inverse characteristic acquiring section 48 acquires the output signal Y from the distorted signal recording section 42b, and the ideal signal Yt from the ideal signal recording section 46. The inverse characteristic acquiring section 48 acquires the function $h^{-1}$, namely the relation of the ideal signal Yt with respect to the output signal Y. The function $h^{-1}$ is applied to the distortion compensator 50.

Further, with reference to FIG. 7, the input terminal 22a and the output terminal 22q of the switch 22 are connected, the input terminal 24b and the output terminal 24q of the switch 24 are connected, and the input terminal 26a and the output terminal 26q of the switch 26 are connected to each other.

The input signal X generated by the signal source 10 is applied to the distortion compensator 50 via the switch 22. The distortion compensator 50 receives the input signal X, converts the input signal X based upon the function $h^{-1}$, and outputs the input signal $h^{-1}(X)$ which is distortion-compensated. The input signal $h^{-1}(X)$, which is distortion-compensated, is applied to the device under test 30 via the switch 24. The device under test 30 amplifies the input signal $h^{-1}(X)$, which is distortion compensated, and outputs a signal Y'. The signal Y' is transmitted by the antenna 60.

Figure 8:
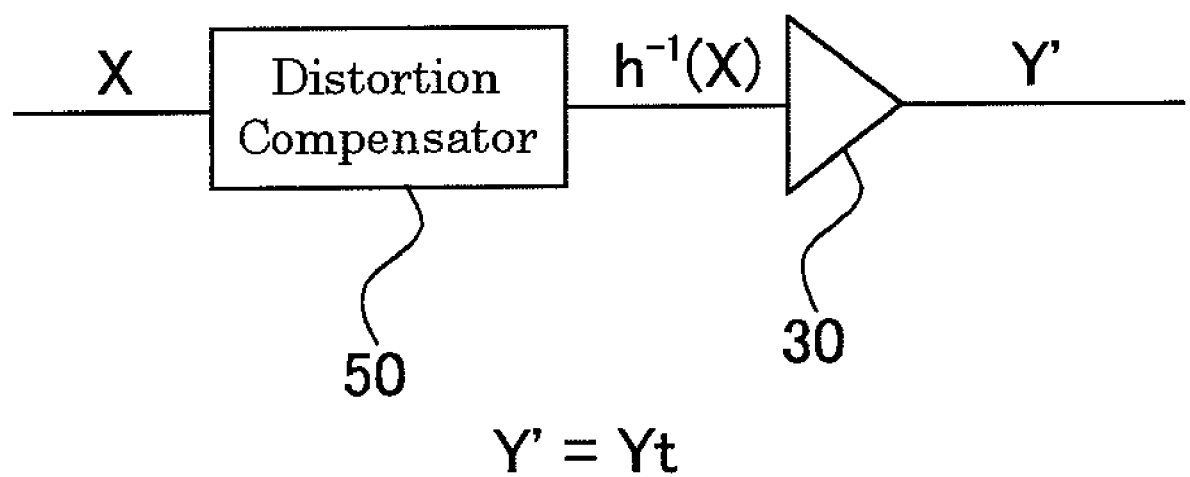
FIG. 8 is a conceptual diagram describing the signal Y'.

FIG. 8 is a conceptual diagram describing the signal Y'. The distortion compensator 50 outputs the input signal $h^{1-}(X)$ which is distortion-compensated. The signal output from the device under test 30 is represented as $Y'=f(h^{-1}(X))$. Since $h^{-1}(Y)=g(f^{-1}(Y))$, the signal Y' is represented as $f(g(f^{-1}(X)))$. The function f and the function $f^{-1}$ cancel out, and the signal Y' is thus represented as g(X). Since the ideal signal Yt is represented as g(X), the signal Y' output from the device under test 30 is the ideal signal Yt. Namely, the distortion compensator 50 causes the signal output from the device under test 30 to be the ideal signal Yt.

According to the first embodiment, the nonlinear distortion caused by the device under test 30 can be compensated based upon the inverse characteristic $h^{-1}$ relating to the characteristic of the device under test 30. Namely, the distortion compensator 50 converts the input signal X generated by the signal source 10 based upon the inverse characteristic $h^{-1}$, and outputs $h^{-1}(X)$. If $h^{-1}(X)$ is applied to the device under test 30, the ideal signal Yt is output.

SECOND EMBODIMENT

A second embodiment is different from the first embodiment in that a waveform of the input signal generated by the signal source 10 is recorded in a waveform recording section 80, and the like.

Figure 9:
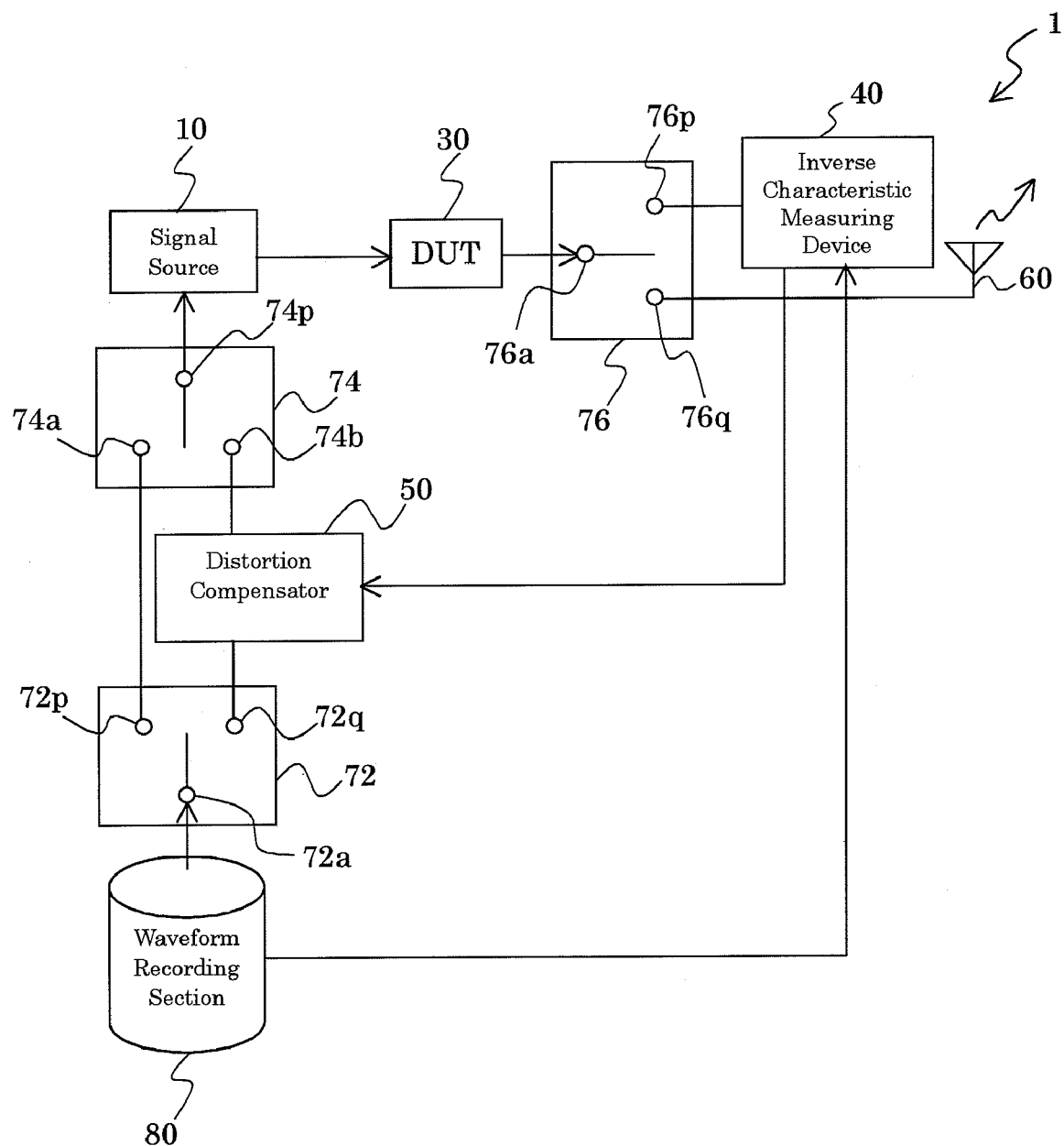
FIG. 9 is a functional block diagram showing a configuration of the transmission system 1 according to the second embodiment of the present invention.

FIG. 9 is a functional block diagram showing a configuration of the transmission system 1 according to the second embodiment of the present invention. The transmission system 1 is provided with the signal source 10, the device under test 30, the inverse characteristic measuring device 40, the distortion compensator 50, the antenna 60, switches 72, 74, and 76, and the waveform recording section 80. In the following section, like components are denoted by like numerals as of the first embodiment, and will be explained in no more details.

The device under test 30 and the antenna 60 are similar to those in the first embodiment, and a description thereof, therefore, is omitted.

The signal source 10 generates an input signal applied to the device under test 30. However, the waveform of the input signal is based upon recorded contents in the waveform recording section 80. In more detail, the waveform of the input signal generated by the signal source 10 is the waveform of an input signal which is the recorded content of the waveform recording section 80 or the waveform of an input signal, which is distortion-compensated, output from the distortion compensator 50.

The waveform recording section 80 records waveforms of input signals. For example, the recorded contents in the waveform recording section 80 are digital data of an AWG (Arbitrary Waveform Generator).

The switch 72 leads the recorded content in the waveform recording section 80 to the distortion compensator 50 or the switch 74. The switch 72 includes an input terminal 72a, and output terminals 72p and 72q. The input terminal 72a is connected to the waveform recording section 80. The output terminal 72p is connected to the switch 74. The output terminal 72q is connected to the distortion compensator 50. The switch 72 connects the input terminal 72a to the output terminal 72p or the output terminal 72q.

The switch 74 leads the waveform of the input signal which is the recorded content in the waveform recording section 80 or the waveform of the distortion-compensated input signal output from the distortion compensator 50, to the signal source 10. The switch 74 includes input terminals 74a and 74b, and an output terminal 74p. The input terminal 74a is connected to the output terminal 72p of the switch 72. The input terminal 74b is connected to the distortion compensator 50. The output terminal 74p is connected to the signal source 10. The switch 74 connects the input terminal 74a or the input terminal 74b to the output terminal 74p.

The switch 76 leads the output signal output from the device under test 30 to the antenna 60 or the inverse characteristic measuring device 40. The switch 76 includes an input terminal 76a, and output terminals 76p and 76q. The input terminal 76a is connected to the device under test 30. The output terminal 76p is connected to the inverse characteristic measuring device 40. The output terminal 76q is connected to the antenna 60. The switch 76 connects the input terminal 76a to the output terminal 76p or the output terminal 76q.

Figure 10:
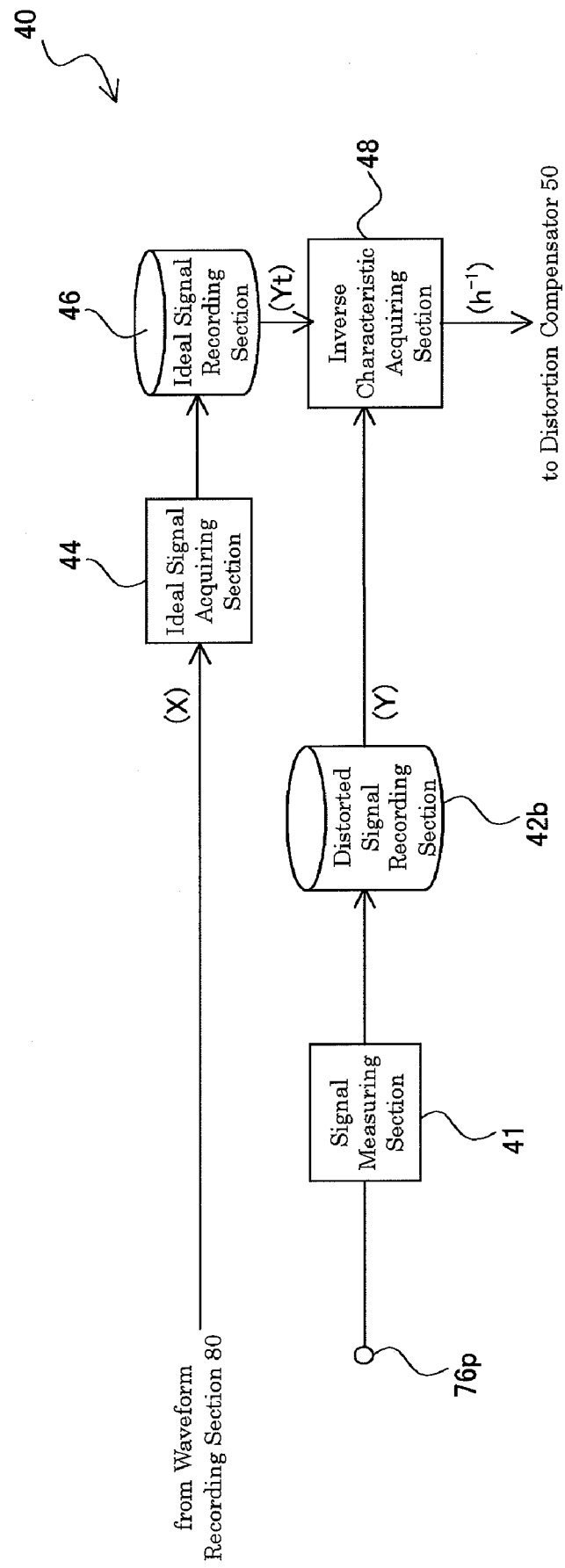
FIG. 10 is a functional block diagram showing a configuration of the inverse characteristic measuring device 40 according the second embodiment.

FIG. 10 is a functional block diagram showing a configuration of the inverse characteristic measuring device 40 according the second embodiment. The inverse characteristic measuring device 40 is provided with the signal measuring section 41, the distorted signal recording section 42b, the ideal signal acquiring section 44, the ideal signal recording section 46, and the inverse characteristic acquiring section 48. The inverse characteristic measuring device 40 is used to obtain the function $h^{-1}$, namely the relation of the ideal signal Yt with respect to the output signal Y.

The signal measuring section 41 measures a signal received from the output terminal 76p of the switch 76. For example, the signal measuring section 41 measures the power and the phase of the signal. The signal output from the output terminal 76p is the output signal output from the device under test 30. The signal measuring section 41 thus measures the output signal.

The ideal signal acquiring section 44 reads out the waveform recorded in the waveform recording section 80. The ideal signal acquiring section 44 obtains an ideal signal output from the ideal device under test 30 if the input signal having the waveform recorded in the waveform recording section 80 is applied to the ideal device under test 30. For example, if the ideal signal is represented as Yt=g(X), the ideal signal Yt is acquired by assigning the waveform recorded in the waveform recording section 80 to X.

The deformed signal recording section 42b, the ideal signal recording section 46, and the inverse characteristic acquiring section 48 are similar to those in the first embodiment, and will be explained in no more details.

The distortion compensator 50 receives the waveform recorded in the waveform recording section 80 from the output terminal 72q of the switch 72, and converts the waveform based upon the function $h^{-1}$. The distortion compensator 50 outputs the waveform converted based upon the function $h^{-1}$ to the input terminal 74b of the switch 74.

Figure 11:
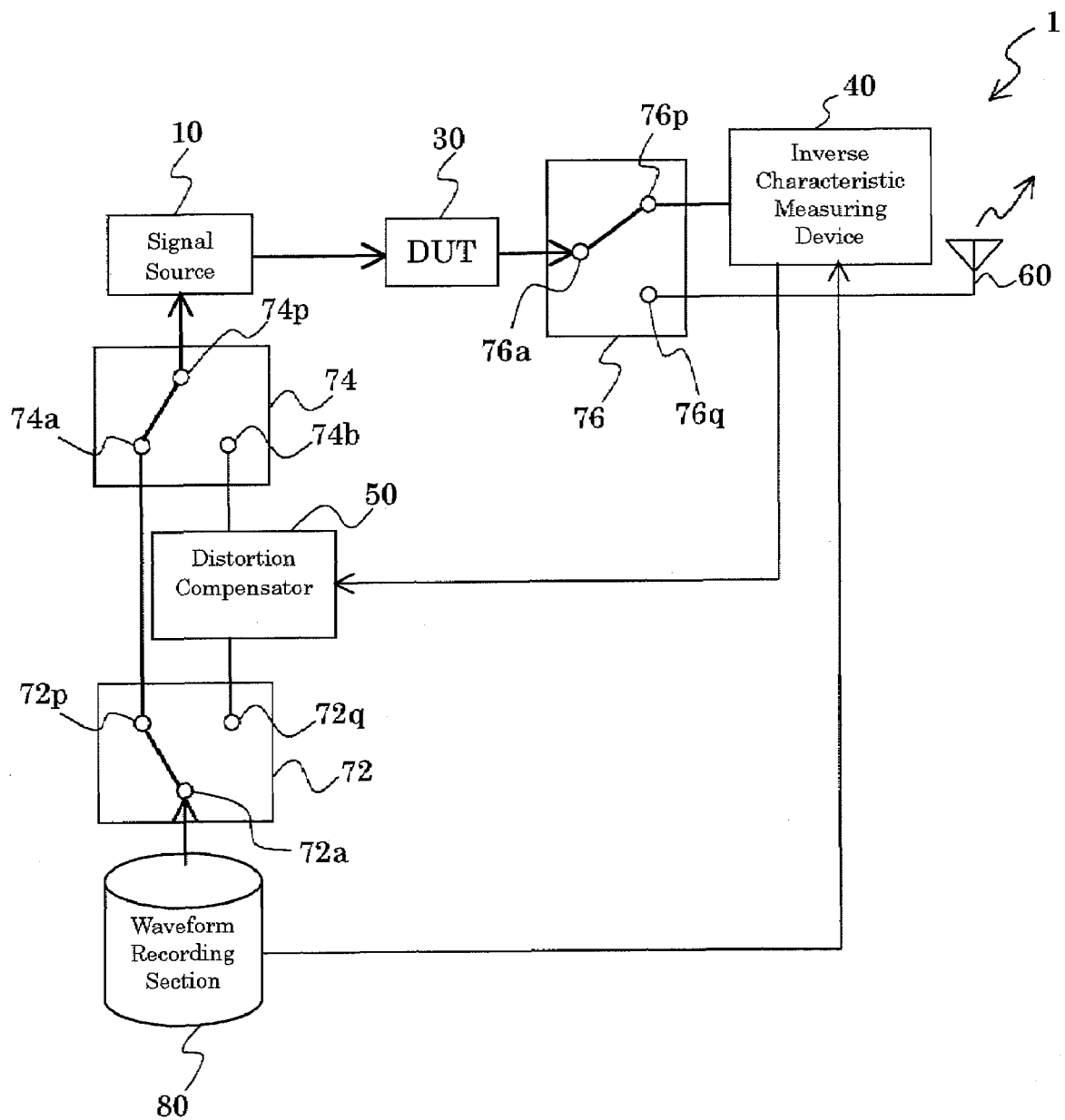
FIG. 11 is a diagram showing connection states of the switches 72, 74, and 76 upon the measurement of the output signal Y.
Figure 12:
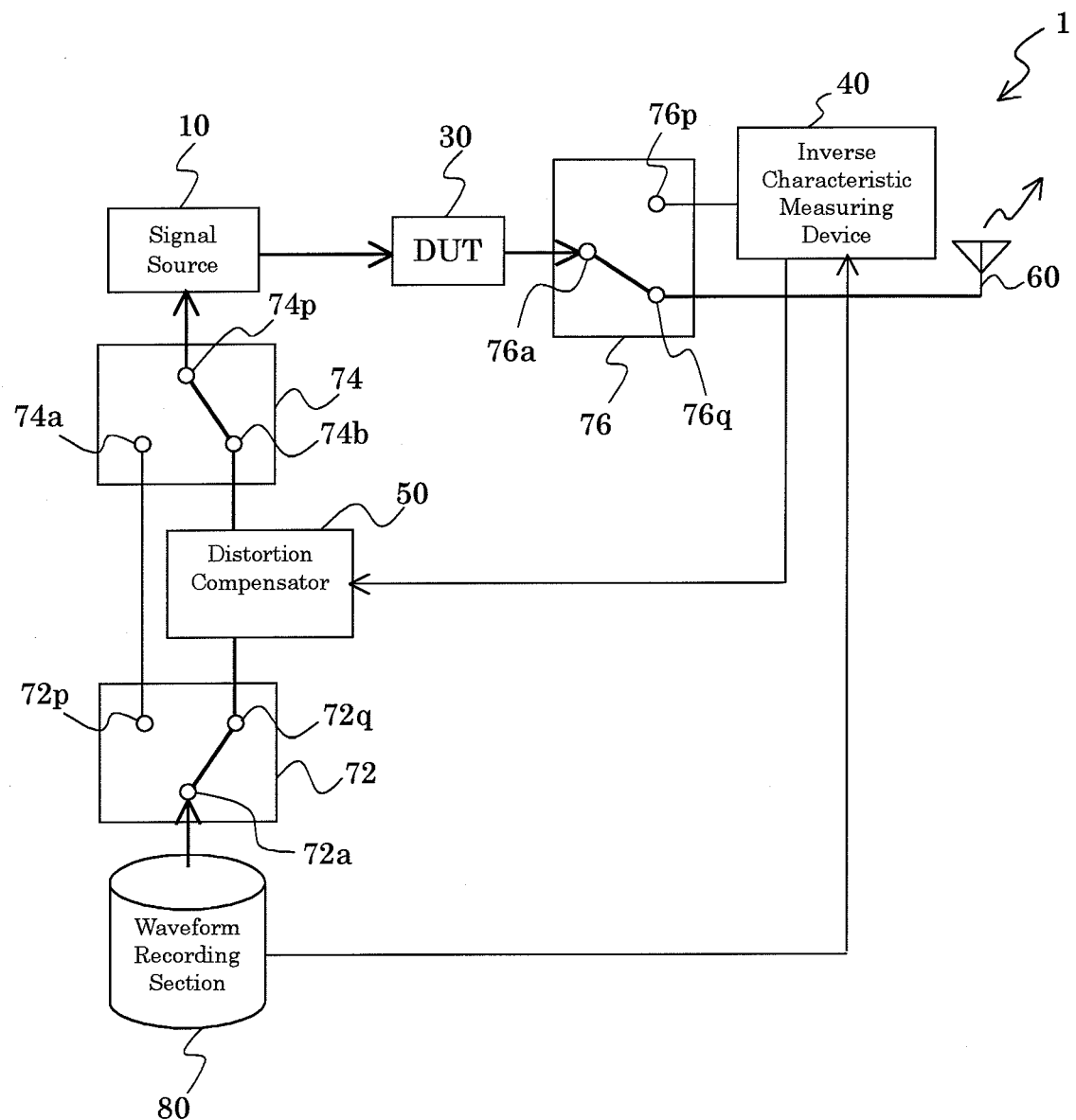
FIG. 12 is a diagram showing connection states of the switches 72, 74, and 76 upon the distortion compensation by the distortion compensator 50.

A description will now be given of an operation of the second embodiment with reference to FIGS. 11 and 12. It should be noted that FIG. 11 shows connection states of the switches 72, 74, and 76 upon the measurement of the output signal Y. FIG. 12 shows connection states of the switches 72, 74, and 76 upon the distortion compensation by the distortion compensator 50.

First, with reference to FIG. 11, the input terminal 72a and the output terminal 72p of the switch 72 are connected, the input terminal 74a and the output terminal 74p of the switch 74 are connected, and the input terminal 76a and the output terminal 76p of the switch 76 are connected to each other.

The waveform recorded in the waveform recording section 80 is applied to the signal source 10 via the switches 72 and 74. The signal source 10 generates the input signal having the waveform recorded in the waveform recording section 80. The input signal X generated by the signal source 10 is applied to the device under test 30. The device under test 30 outputs the output signal Y. The output signal Y is applied to the inverse characteristic measuring device 40 via the switch 76. The signal measuring section 41 of the inverse characteristic measuring device 40 measures the output signal Y, and records a measured result in the distorted signal recording section 42b.

Then, the ideal signal acquiring section 44 reads out the waveform recorded in the waveform recording section 80.

The ideal signal acquiring section 44 obtains the ideal signal Yt output from the ideal device under test 30 if the input signal having the waveform recorded in the waveform recording section 80 is applied to the ideal device under test 30. The ideal signal Yt is recorded in the ideal signal recording section 46.

The inverse characteristic acquiring section 48 acquires the output signal Y from the distorted signal recording section 42b, and the ideal signal Yt from the ideal signal recording section 46. The inverse characteristic acquiring section 48 acquires the function $h^{-1}$, namely the relation of the ideal signal Yt with respect to the output signal Y. The function $h^{-1}$ is applied to the distortion compensator 50.

Further, with reference to FIG. 12, the input terminal 72a and the output terminal 72q of the switch 72 are connected, the input terminal 74b and the output terminal 74p of the switch 74 are connected, and the input terminal 76a and the output terminal 76q of the switch 76 are connected to each other.

The waveform recorded in the waveform recording section 80 is applied to the distortion compensator 50 via the switch 72. The distortion compensator 50 receives the waveform, and converts the waveform based upon the function $h^{-1}$. The waveform converted based upon the function $h^{-1}$ is applied to the signal source 10 via the switch 74. The signal source 10 generates the input signal having the waveform converted based upon the function $h^{-1}$. The input signal generated by the signal source 10 is represented as $h^{-1}(X)$, and is applied to the device under test 30. The device under test 30 outputs the output signal Y'. The output signal Y is transmitted from the antenna 60 via the switch 76. It should be noted that the signal Y' is considered as the ideal signal Yt as in the first embodiment.

According to the second embodiment, as the first embodiment, the nonlinear distortion caused by the device under test 30 can be compensated based upon the inverse characteristic $h^{-1}$ relating to the characteristic of the device under test 30. Namely, the distortion compensator 50 converts the waveform recorded in the waveform recording section 80 based upon the inverse characteristic $h^{-1}$, and supplies the signal source 10 with the converted waveform. Thus, the input signal generated by the signal source 10 is $h^{-1}(X)$. If $h^{-1}(X)$ is applied to the device under test 30, the ideal signal Yt is output.

It should be noted that the device under test 30 may be removed, and the signal source 10 and the input terminal 76 of the switch 76 may be connected directly in the second embodiment. In this case, the signal measuring section 41 measures the input signal generated by the signal source 10. The inverse characteristic acquiring section 48 acquires the function $h^{-1}$, namely the relation of the ideal signal Yt with respect to the measured input signal. It is possible to compensate the distortion upon the transmission from the signal source 10 to the antenna 60 by causing the distortion compensator 50 to convert the waveform recorded in the waveform recording section 80 based upon the inverse characteristic $h^{-1}$, and applying the converted waveform to the signal source 10.

Moreover, the above-described embodiments may be realized in the following manner. A computer is provided with a CPU, a hard disk, and a media (such as a CD-ROM) reader, and the media reader is caused to read a medium recording a program realizing the above-described respective sections, thereby installing the program on the hard disk. This method may also realize the above-described embodiments.

The invention claimed is:

1. An inverse characteristic measuring apparatus comprising:
   a signal measurer that measures an output signal Y output from a device under test as a result of the device under test being supplied with an input signal;
   an ideal signal acquirer that acquires an ideal signal Yt that would be output from the device under test based upon the input signal if the device under test were ideal; and
   an inverse characteristic acquirer that acquires an inverse characteristic $h^{-1}$ which is a relation of the ideal signal Yt with respect to the output signal Y,
   wherein the output signal Y, the ideal signal Yt, and the inverse characteristic $h^{-1}$ have the relationship $Yt = h^{-1}(Y)$.

2. The inverse characteristic measuring apparatus according to claim 1, further comprising:
   an input signal measurer that measures the input signal,
   wherein said ideal signal acquirer acquires the ideal signal Yt based upon the measured input signal.

3. A distortion compensation apparatus that acquires the inverse characteristic $h^{-1}$ from the inverse characteristic measuring apparatus according to claim 2, and provides the device under test with a result of a conversion of the input signal based upon the inverse characteristic $h^{-1}$.

4. The inverse characteristic measuring apparatus according to claim 1, wherein:
   the input signal is generated based upon recorded content in a waveform recorder that records a waveform of the input signal; and
   said ideal signal acquirer acquires the ideal signal Yt based upon the waveform recorded in the waveform recorder.

5. A distortion compensation apparatus that acquires the inverse characteristic $h^{-1}$ from the inverse characteristic measuring apparatus according to claim 4, and converts the waveform recorded in the waveform recorder based upon the inverse characteristic $h^{-1}$,
   wherein the input signal is generated based upon a result of the conversion by the distortion compensation apparatus.

6. A distortion compensation apparatus that acquires the inverse characteristic $h^{-1}$ from the inverse characteristic measuring apparatus according to claim 1, and provides the device under test with a result of a conversion of the input signal based upon the inverse characteristic $h^{-1}$.

7. An inverse characteristic measuring apparatus comprising:
   an input signal measurer that measures an input signal generated based upon recorded content in a waveform recorder that records a waveform;
   an ideal signal acquirer that acquires the recorded content in said waveform recorder as an ideal signal Yt; and
   an inverse characteristic acquirer that acquires an inverse characteristic $h^{-1}$ which is a relation of the ideal signal Yt with respect to the measured input signal,
   wherein the ideal signal Yt and the inverse characteristic $h^{-1}$ have the relationship $Yt = h^{-1}(Y)$, Y being an output signal output from a device under test as a result of the device under test being supplied with the input signal.

8. A distortion compensation apparatus that acquires the inverse characteristic $h^{-1}$ from the inverse characteristic measuring apparatus according to claim 7, and converts the waveform recorded in the waveform recorder based upon the inverse characteristic $h^{-1}$,
   wherein the input signal is generated based upon a result of the conversion by the distortion compensation apparatus.

9. An inverse characteristic measuring method comprising:
   measuring an output signal Y output from a device under test as a result of the device under test being supplied with an input signal;
   acquiring an ideal signal Yt that would be output from the device under test based upon the input signal if the device under test were ideal; and
   acquiring an inverse characteristic $h^{-1}$ which is a relation of the ideal signal Yt with respect to the output signal Y,
   wherein the output signal Y, the ideal signal Yt, and the inverse characteristic $h^{-1}$ have the relationship $Yt=h^{-1}(Y)$.

10. An inverse characteristic measuring method comprising:
    measuring an input signal generated based upon recorded content in a waveform recorder that records a waveform;
    acquiring the recorded content in said waveform recorder as an ideal signal Yt; and
    acquiring an inverse characteristic $h^{-1}$ which is a relation of the ideal signal Yt with respect to the measured input signal,
    wherein the ideal signal Yt and the inverse characteristic $h^{-1}$ have the relationship $Yt=h^{-1}(Y)$, Y being an output signal output from a device under test as a result of the device under test being supplied with the input signal.

11. A computer-readable medium having a program of instructions for execution by a computer to perform an inverse characteristic measuring process, said inverse characteristic measuring process comprising:
    measuring an output signal Y output from a device under test as a result of the device under test being supplied with an input signal;
    acquiring an ideal signal Yt that would be output from the device under test based upon the input signal if the device under test were ideal; and
    acquiring an inverse characteristic $h^{-1}$ which is a relation of the ideal signal with respect to the output signal Y,
    wherein the output signal Y, the ideal signal Yt, and the inverse characteristic $h^{-1}$ have the relationship $Yt=h^{-1}(Y)$.

12. A computer-readable medium having a program of instructions for execution by a computer to perform an inverse characteristic measuring process, said inverse characteristic measuring process comprising:
    measuring an input signal generated based upon recorded content in a waveform recorder that records a waveform;
    acquiring the recorded content in said waveform recorder as an ideal signal Yt; and
    acquiring an inverse characteristic $h^{-1}$ which is a relation of the ideal signal Yt with respect to the measured input signal,
    wherein the ideal signal Yt and the inverse characteristic $h^{-1}$ have the relationship $Yt=h^{-1}(Y)$, Y being an output signal output from a device under test as a result of the device under test being supplied with the input signal.

* * * * *